(12) United States Patent  
Tenucci et al.

(10) Patent No.: US 8,928,346 B2
(45) Date of Patent: Jan. 6, 2015

(54) METHOD FOR AN IMPROVED CHECKING OF REPEATABILITY AND REPRODUCIBILITY OF A MEASURING CHAIN FOR SEMICONDUCTOR DEVICE TESTING

(75) Inventors: Sergio Tenucci, Villasanta (IT); Alberto Pagani, Nova Milanese (IT); Marco Spinetta, Pozzuolo Martesana (IT); Bernard Ranchoux, Saint Imier (FR)

(73) Assignees: STMicroelectronics S.r.l., Agrate Brianza (IT); STMicroelectronics (Grenoble 2) SAS, Grenoble (FR)

( * ) Notice: Subject to any disclaimer, the term of this patent is extended or adjusted under 35 U.S.C. 154(b) by 924 days.

(21) Appl. No.: 13/092,772

(22) Filed: Apr. 22, 2011

(65) Prior Publication Data

US 2011/0254580 A1   Oct. 20, 2011

Related U.S. Application Data

(63) Continuation-in-part of application No. PCT/IB2008/003660, filed on Oct. 22, 2008.

(51) Int. Cl.
*G01R 31/26* (2014.01)
*G05B 19/418* (2006.01)
*G01R 31/28* (2006.01)

(52) U.S. Cl.
CPC ...... *G05B 19/41875* (2013.01); *G01R 31/2894* (2013.01)
USPC ................. 324/762.05; 324/762.01; 324/73.1

(58) Field of Classification Search
None
See application file for complete search history.

(56) References Cited

U.S. PATENT DOCUMENTS 6,392,434 B1\* 5/2002 Chiu ..................... 324/759.01
2009/0079419 A1\* 3/2009 Lui ............................ 324/158.1

OTHER PUBLICATIONS

Flynn, M., "Regression Analysis of Automated Measurment Systems," IEEE Autotestcon, Salt Lake City, UT, Sep. 8-11, 2008, 7 pages.
Sivaji, A., "Measurement System Analysis," Proceedings of the Third IEEE International Workshop on Electronic Design. Test and Applications (DELTA '06), 2005, 4 pages.

\* cited by examiner

*Primary Examiner* — Minh N Tang
(74) *Attorney, Agent, or Firm* — Seed IP Law Group PLLC

(57) ABSTRACT

A method provides an improved checking of repeatability and reproducibility of a measuring chain, in particular for quality control by semiconductor device testing. The method includes testing steps provided for multiple and different devices to be subjected to measurement or control through a measuring system that includes at least one chain of measuring units between a testing apparatus (ATE) and each device to be subjected to measurement or control. Advantageously, the method comprises checking repeatability and reproducibility of each type of unit that forms part of the measuring chain and, after the checking, making a correlation between the various measuring chains as a whole to check repeatability and reproducibility, using a corresponding device subjected to measurement or control.

18 Claims, 15 Drawing Sheets

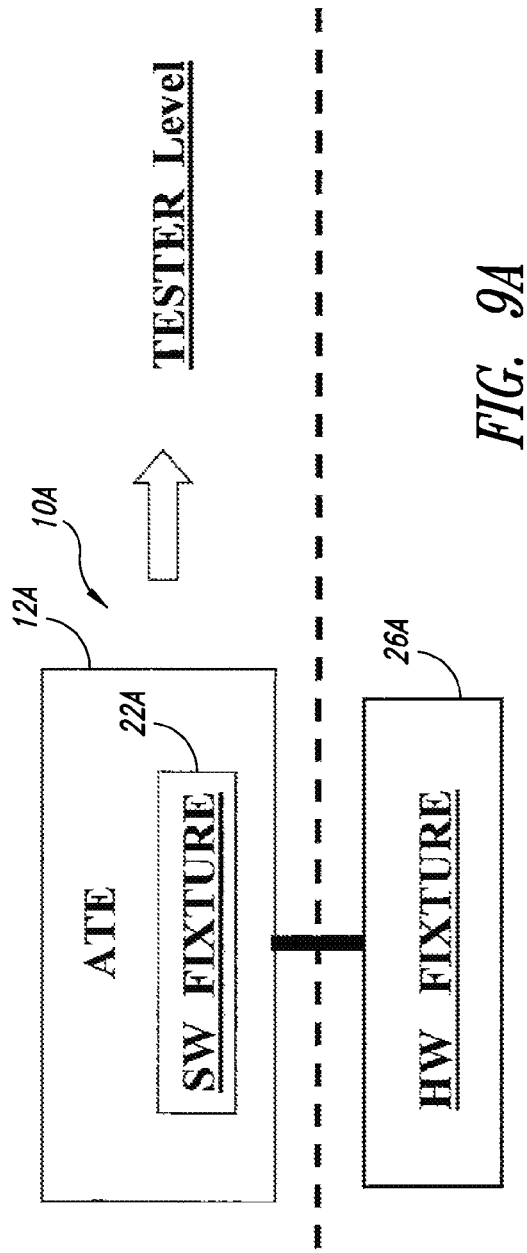
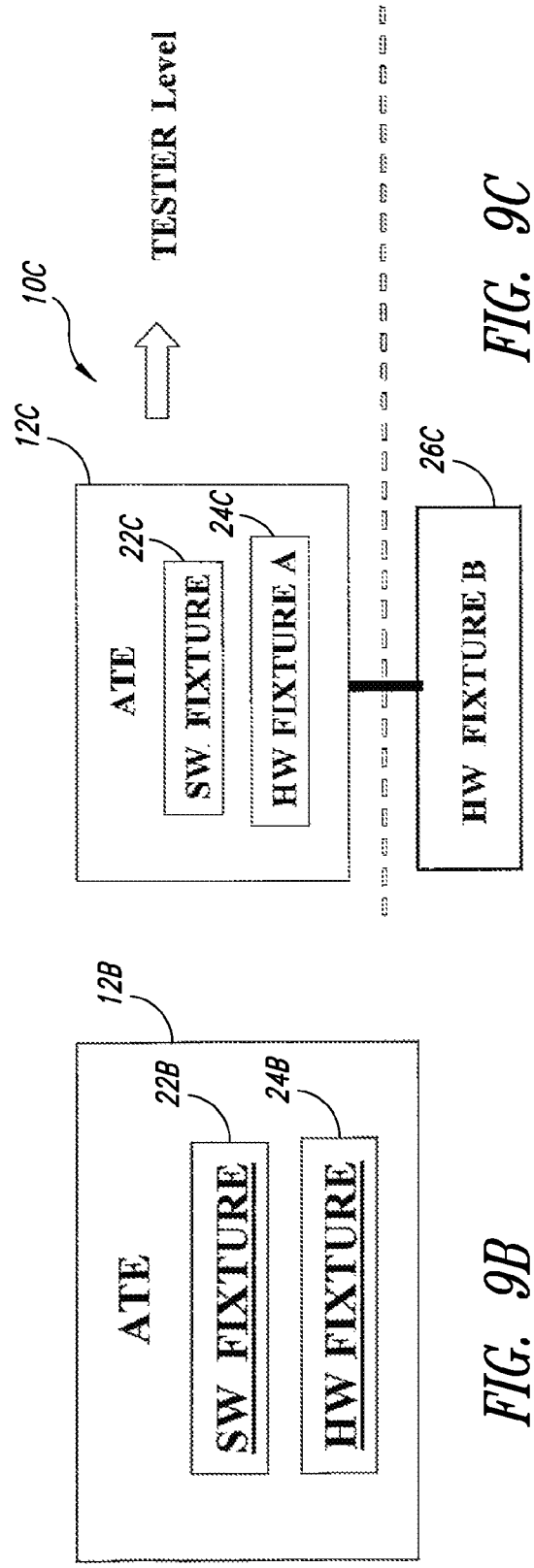
FIG. 9A
FIG. 9B
FIG. 9C

METHOD FOR AN IMPROVED CHECKING OF REPEATABILITY AND REPRODUCIBILITY OF A MEASURING CHAIN FOR SEMICONDUCTOR DEVICE TESTING

BACKGROUND

1. Technical Field

The present disclosure refers to a method for an improved checking of repeatability and reproducibility of a measuring chain, wherein testing steps are foreseen for multiple and different devices to be subjected to measurement or control through a measuring system comprising at least one concatenation of measuring units between a testing apparatus (ATE) and each device to be subjected to measurement or control.

The disclosure in particular, but not exclusively, relates to a methodology foreseen for quality control through the semiconductor device testing, and the following description is made with reference to this field of application with the sole purpose of simplifying its presentation.

2. Description of the Related Art

As it is well known, R&R (Repeatability and Reproducibility) methodologies, applied to measuring systems, and in particular to quality control through testing of semiconductors, have the purpose of ensuring the repeatability and reproducibility of measuring.

Currently, such R&R methodologies are strongly linked to each individual product that is also part of a plurality of products to be subjected to testing with R&R methodology.

In order to try to better understand the problems of this field of application it is worth noting that a generic measuring system is formed from a measurement chain MC arranged in cascade with each other and that represent a concatenation of test units TU, as schematically illustrated in FIG. 1.

For the sake of simplicity of presentation we can consider that each measuring system can actually be represented with a chain of basic test units arranged in cascade, but in any case this is not limiting for the purposes of the present disclosure.

Each test unit TU that forms part of the measurement chain MC can also have a complicated internal structure and interfaces with the other units exchanging information in the form of input/output signals that can be electrical, electronic, luminous or in the form of electromagnetic waves or radiation. The ways in which the information is exchanged between the various units TU is also not limiting for the purposes of the present disclosure.

In general, upstream of the systems chain there are measuring and stimulation instruments, represented here by a single overall system or basic unit called ATE (Automatic Test Equipment).

The ATE is formed from at least one resource capable of performing at least one type of measurement.

Each resource of the ATE in general should respect a specification. In its most common formulation the specification foresees that the resource can measure values of a specific magnitude located between a minimum LSL (Lower Specification Limit) and a maximum USL (Upper Specification Limit), as schematically illustrated in FIG. 2.

If the measurements are located within the specification range [LSL; USL] it is considered that the considered resource is working correctly (Pass) within its specification. Otherwise, if the measurement does not satisfy the specification, it means that such a resource has an anomalous behaviour (Fail) that can be investigated and evaluated in order to restore the correct operation of the resource itself.

In order to check the specification values of the various resources of the ATE, a calibration tool can be available that, hereafter, we shall call Checker, which can be of the hardware (HW) and/or software (SW) type and that is used following a dedicated procedure.

This calibration tool just checks that the various resources are within the specification and indicates as possibly anomalous only those resources that are not within their specification and that give a "Fail" result.

Downstream of the measurement chain MC there is the object or device that should be subjected to measurement, represented by a single overall unit called DUT (Device Under Test) schematically illustrated in FIGS. 1 and 3.

Of course, the DUT can consist of at least one element on which it is desired to perform at least one measurement, to obtain at least one parameter that is measured with at least one measuring technique, or the value of which is estimated from at least one measurement.

In general, it is also possible to perform the measurements of a plurality of DUTs in parallel, as shown in FIG. 3, obviously if the measuring chain has this ability.

However, for the purposes of the present disclosure, it should be considered that all of the DUTs measured in parallel are like a single overall DUT.

Between the ATE and the DUT there can be at least one test unit TU of the systems chain SC that acts to adapt and/or interface together the ATE and the DUT. This unit can also expand the measuring potentials and capabilities of the ATE, or focus/size the capabilities of the ATE to the specific DUT.

It may also be the case that, even if the resources of the ATE respect their specification, this may not be sufficient to satisfy the quality specifications for the testing of the DUT.

Indeed, the last purpose of the measuring system as a whole is that of identifying the DUTs that are defective, performing at least one measurement on the DUT itself and determining whether or not the DUT is defective based upon some criteria.

After the measurement, the defective DUTs can be separated from the others and discarded.

In the case in which an ATE incorporates at least two different resources of the same type, even if such resources satisfy their specifications, it can be foreseen for such resources to provide even considerably different measurements of the same magnitude measured whilst operating on the same DUT.

In short, the testing system should overall satisfy not only its own specification, but repeatability and reproducibility of the measurement should also be taken into account. In this field by repeatability we mean the variation of the measurement obtained with a single measuring resource ATE, which at different times carries out the measurement of the same characteristic on the same DUTs; therefore, the measurement variation on the same ATE is measured.

By reproducibility we mean the variation in the average of the measurements made by different ATEs that measure the same characteristic on the same DUTs.

The R&R technique in itself combines repeatability and reproducibility and it is calculated using ANOVA (ANalysis Of VAriance) statistical techniques, as schematically illustrated in FIGS. 4A-4C, where the word Appraiser indicates the measuring chain MC.

According to the current prior art technique, the so-called golden samples, or reference units, are used, which are inserted into the measurement chain MC in place of the DUT, on which the various ATEs (each with its own system chain) perform the measurement of at least one characteristic for N (N>1) times that we shall call Cycles, in M (M>1) different time periods that we shall call Runs, on the different measuring systems chains, as schematically illustrated in FIG. 5.

These golden samples are generally linked to the specifications for the end product, and usually are samples of the same end product.

In particular, in the technical field of semiconductor devices, if the DUT consists of chips on a wafer, the measuring chain MC generally comprises the ATE that is interfaced with the DUT through test units TU referred to as a Jig unit (or a DIB-Device Interface Board) and a probe card, as illustrated in FIG. 6A.

The Jig unit is optional and might not be present in the measuring chain. The Jig unit comprises circuits that interface the ATE with the device DUT through the probe card; the latter comprises different probes that make contact with the terminal pads of at least one chip on the wafer.

If the device DUT comprises at least one chip encapsulated in a package, or more than one chip encapsulated in the same package (System in a Package), the measurement chain MC comprises the ATE that is interfaced with the DUT through a Jig unit (or DIB) and a board with a test unit TU known as a socket in which the package that contains the chip or chips is housed.

Therefore, the golden samples can be some chips present on the wafer or in a package, in various forms, and quality control foresees that the R&R, in other words the Repeatability and Reproducibility, of the entire measuring chain be evaluated.

The evaluation of the R&R is carried out using an assortment of measuring chains MC, i.e. measuring chains with various combinations of one or more ATE devices with various adapters and interfaces as the test units. The evaluation is therefore carried out on the various measuring chains using the golden samples, performing the measurement of at least one feature or characteristic parameter of such golden samples.

In general, it is suitable to measure a few tens of different characteristic parameters, which are monitored with suitable statistical techniques, like for example the methodology known as "ANOVA", to ensure the R&R, i.e. the Repeatability and Reproducibility of the various measuring systems.

Based upon the various and different types of DUT, the family and/or configuration type of the ATE and the consequent measuring chain MC shall of course change. In any case, checking the R&R of measuring systems in normal working conditions is generally a quality specification that should be satisfied, and it should be considered ever more important the higher the desired quality levels, for example for products in the automotive sector.

Given that the golden samples are linked to each product, in the cases in which there are many different products, the repeatability and reproducibility of the measuring systems should be checked on different products, which is a great burden because of the large number of golden samples to be identified and certificated.

Moreover, for each group of golden samples it may be desired to provide a specific setup of the measuring chain, to obtain the data from which to calculate repeatability and reproducibility.

Consequently, it becomes a great burden both in terms of time and costs and in terms of resources, to check repeatability and reproducibility on the different measuring chains, using the various types of golden samples.

If then the measuring chains are used in a production context, part of the time of the various measuring chains to carrying out measurements on the golden samples is dedicated to check repeatability and reproducibility.

Moreover, there will also be a plurality of types and families of golden samples that will not always be the same, since for each new product new golden samples, that add to the existing ones, should be identified and certificated.

In performing the check of repeatability and reproducibility the golden samples can become damaged and therefore new golden samples are introduced, and this has an impact upon costs, time and resources. In particular, in the field of semiconductors, the golden samples are frequently damaged and would often be replaced.

The greater the human involvement to carry out the measurements, the lower the repeatability and reproducibility of the measuring system, and this can often be partially solved with the introduction of automation of the measuring process.

Considering various measuring chains, if one of them is not repeatable and reproducible with respect to the others, then it will not be known which part of the measuring chain does not satisfy repeatability and reproducibility, and therefore it will not be known a priori on which elements of the measuring chain there needs to be an intervention to restore repeatability and reproducibility of the entire measuring chain to thus align it with the other measuring chains.

For example, if the golden samples are chips still on a wafer, they are interfaced with the measuring chain through a probe card the probes of which damage the contact terminal pads. In general, the contact between probe and pad is not repeatable and reproducible, since the probe that makes contact with the pad changes and damages the pad itself, and this can bring problems in the electrical measurements carried out by the measuring chain on the device of the wafer.

Particles can build up or can form oxides on the probes as well that alter the measurements and that decrease the reliability of the evaluation of repeatability and reproducibility of the overall system.

Indeed, all of this can for example translate into a random variation in contact resistance (in general impedance) between probe and pad, which alters the value of the measurements.

The probe card is subject to wear and deterioration, and this influences the measurements taken for repeatability and reproducibility; indeed, the probes wear out over time and change their mechanical parameters, like: the alignment of the probes, their planarity, their length, the force exerted on the pad, the shape of the tip.

This list is not exhaustive of all of the possible deterioration that can occur on a probe.

Over time, by using the probes the measurement can also be repeated, but the same measurement conditions cannot be reproduced.

Furthermore, after a large number of contacts that damage the pads, some wafers can no longer continue in the production process and therefore are not sold, but must be discarded with a consequent additional cost.

By using production devices like golden samples, if the normal testing methods of semiconductors are used, the various devices can be subjected to electrical and environmental stress that can alter their characteristics, and this reduces the reproducibility of the conditions in which the measurement is carried out.

For example, electrical stress can be used on the chips to check the oxide status, but such electrical stress can alter the oxide at crystal lattice level.

Consequently, both the action of the probes, and the action of stress ensure that it is not possible to carry out in full the repeatability and reproducibility check of the measuring chain on the DUTs that will then be measured in real conditions.

For example, in order to eliminate the effect of stress it is possible to avoid applying such stress during the repeatability and reproducibility check, and in order to eliminate the effect of the probes it is possible to use encapsulated chips as golden samples. However, by using encapsulated chips some interfaces should be introduced in the measuring chain that are different from those used for the measurements on a wafer, and therefore the measuring chain on which the repeatability and reproducibility check will be carried out should be changed in the different conditions in which the measuring chain itself will operate.

The measuring chains that have ATE with high parallelism are able to measure even hundreds of chips simultaneously, and therefore it is very complex, if not impossible, to use the golden samples approach.

Similarly, it can be said for measuring chains on which repeatability and reproducibility are carried out with golden samples of encapsulated chips that are the normal DUTs the chains should measure.

Indeed, even in these cases there will be contact between the package and the interfaces with the ATE.

It may be considered to solve to problem by welding the encapsulated chip onto a board, but this eliminates the presence of the socket, in which the encapsulated chips are housed to carry out the measurements in normal conditions.

Often for the measurement of the DUT just a part of the potential of the measuring chain is used and therefore also with golden samples only a part of the functionalities of the chain shall be verified.

Basically, if the measuring chain, in particular the ATE, has parts or resources that do not satisfy repeatability and reproducibility, this will be visible only with those types and families of golden samples that use this type of parts or resources to carry out the measurements.

Consequently, a measuring chain can be repeatable and reproducible for a certain class or family or type of golden samples but not for other classes, families or types.

Therefore, certain measuring chains can be used for the measurements of certain classes, families or types of DUTs and not for others, creating economic, managing and production problems, etc.

Moreover, the various golden samples use parts of the chain that are common to many types and/or families of golden samples and this is inefficient.

Therefore, by using golden samples linked to the end product, when considering a plurality of possible end products that are different to each other, it is difficult to ensure repeatability and reproducibility of the various measuring chains as a whole, and in the case of problems it is not easy to understand the causes that alter repeatability and reproducibility and to put it right.

All of this makes the current check of repeatability and reproducibility ineffective or inefficient, especially in a production context, also because the parameters measured are not many in general.

BRIEF SUMMARY

One embodiment of the present disclosure is a repeatability and reproducibility checking methodology that is as independent as possible from the features of the individual product on which it is desired to carry out the check and having functional characteristics such as to allow the limitations and drawbacks still suffered by the methods made according to the prior art to be overcome.

One embodiment of the present disclosure separates the measuring chain into the various basic units, on which repeatability and reproducibility is checked, to then go back to consider the entire measuring chain by carrying out a correlation on the product.

Advantageously, according to the disclosure, the method is no longer focussed on the individual product, and can therefore be applied to a generic group of measuring systems that may still be complex, considering any plurality of products that should be reliably measured independently from the product and from the specific measuring system used.

One embodiment of the present disclosure is a method for an improved checking of repeatability and reproducibility of a measuring chain MC, in particular for the quality control by means of the semiconductor device testing, in which testing steps are foreseen for multiple and different devices to be subjected to measurement or control through a measuring system comprising at least one concatenation of test units between a testing apparatus (ATE) and each device to be subjected to measurement or control, characterised in that it comprises the following steps:

checking repeatability and reproducibility of each type of unit that forms part of the measuring chain of said concatenation;

then making a correlation between the various measuring chains as a whole to check the repeatability and reproducibility, using the corresponding device subjected to measurement or control.

Advantageously, said checking step comprises separating the test unit that depend upon the device subjected to measurement or control, from those that do not depend upon said device.

Moreover, a procedure is provided that comprises the use of a software and/or hardware type fixture associated with said testing apparatus, and possibly incorporating a testing protocol, for checking repeatability and reproducibility of each individual measuring resource or groups of measuring resources that belong to the measuring unit, to evaluate the repeatability and reproducibility of the unit itself. The various groups of resources can also at times comprise common resources, by common resources meaning at least one measuring and/or stimulation tool, like for example at least one signal feeder or generator. In this field, it is also provided a measuring of at least one characteristic of said apparatus for N times or Cycles, carried out in M different time periods that we shall call Runs and on different apparatuses, through a statistical method of the "ANOVA" type.

The characteristics and advantages of the method according to the disclosure shall become clearer from the description, made hereafter, of an example embodiment thereof given for indicating and not limiting purposes with reference to the attached drawings.

BRIEF DESCRIPTION OF THE SEVERAL VIEWS OF THE DRAWINGS

In such drawings:

FIGS. 9A-9D schematically illustrate alternative embodiments of the chain of FIG. 8;

DETAILED DESCRIPTION

Figure 7:
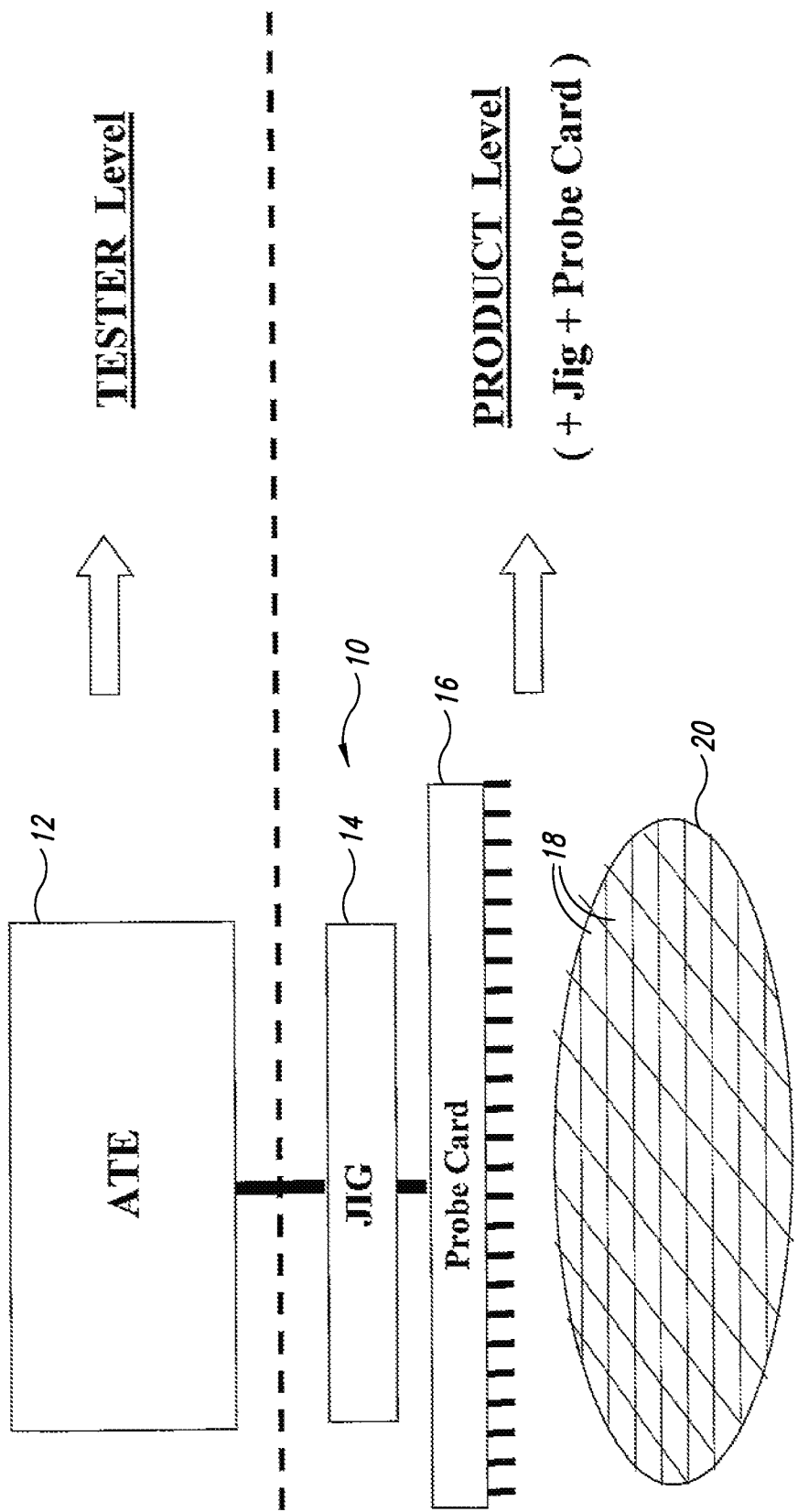
FIG. 7 schematically illustrates a division of a measuring chain carried out by the method for an improved checking of repeatability and reproducibility according to the disclosure.

With particular reference to the example of FIG. 7, a method for an improved checking of a repeatability and reproducibility checking of a measuring chain is now described, in particular for quality control by semiconductor device testing, in which testing steps are foreseen for multiple and different devices to be subjected to measurement or control through a measuring system comprising at least one concatenation of test units between a testing apparatus (ATE) and each device to be subjected to measurement or control.

Figure 1:
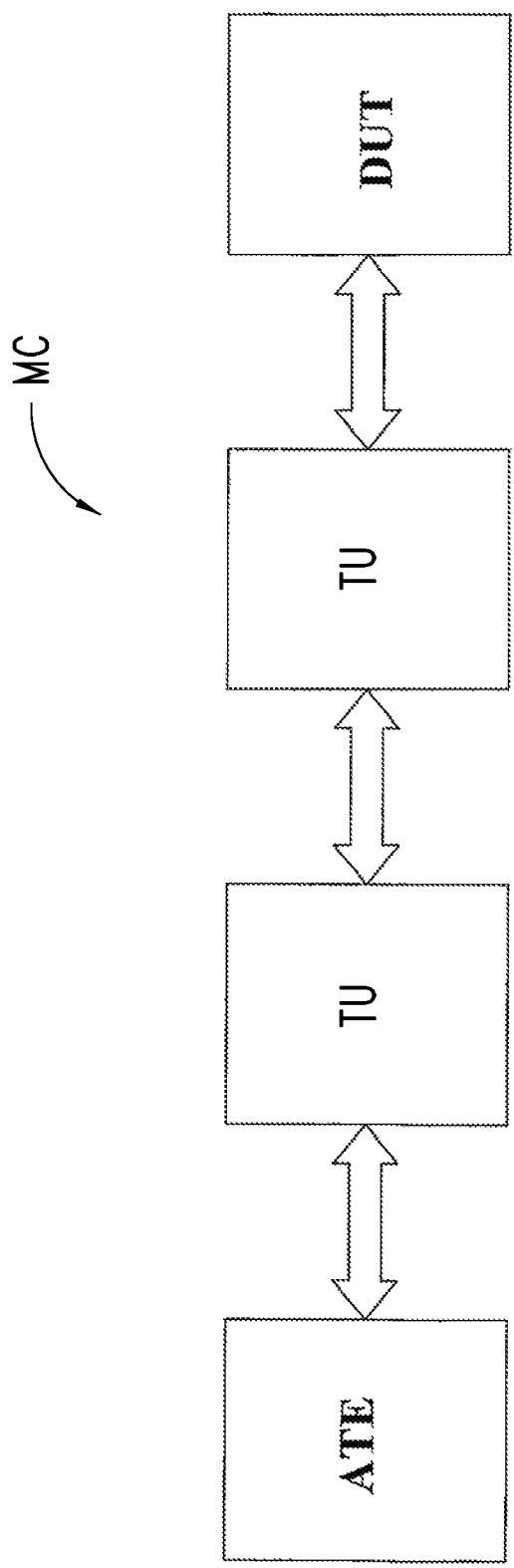
FIG. 1 schematically illustrates a measuring chain, in particular for the semiconductor device testing, realised according to the prior art.
Figure 2:
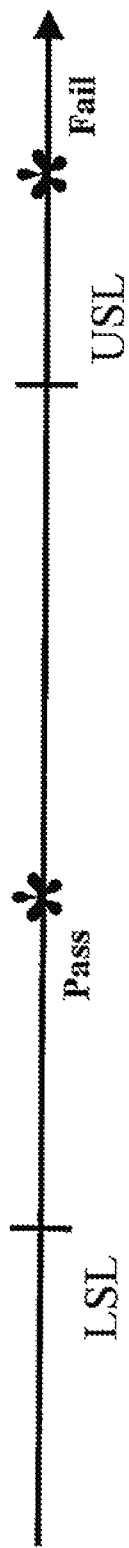
FIG. 2 schematically illustrates a specification to be used in a measuring chain of the type illustrated in FIG. 1.
Figure 3:
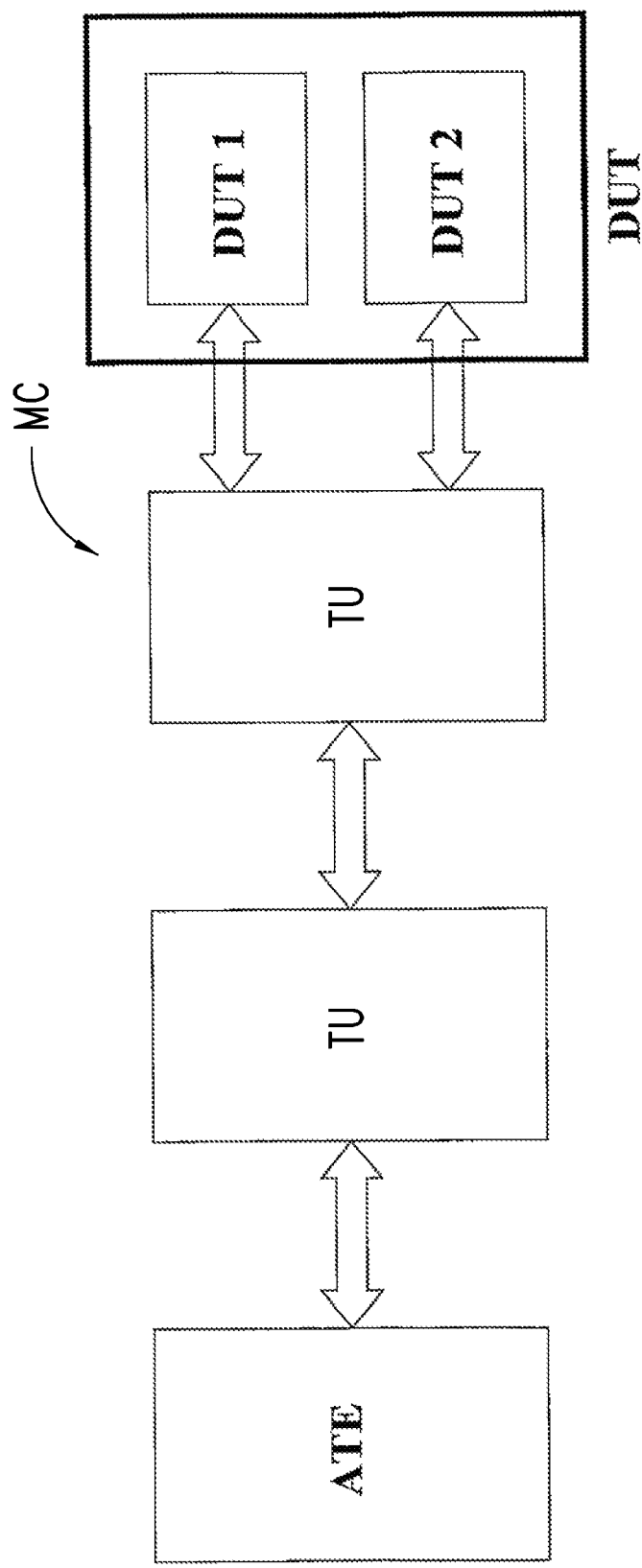
FIG. 3 schematically illustrates a measuring chain together with a device under testing according to the prior art.
Figure 4A:
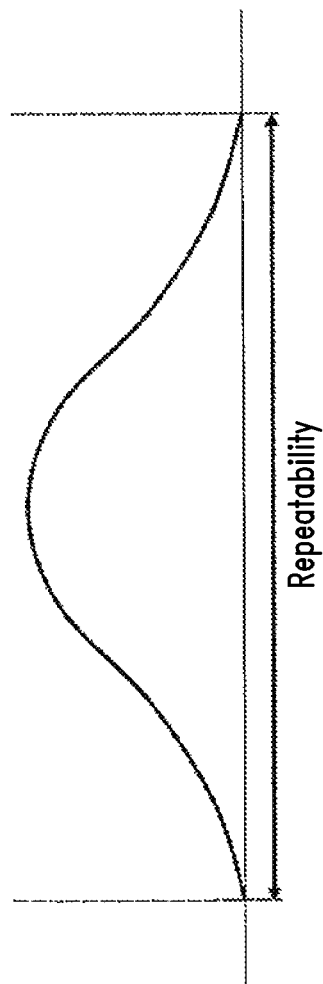
FIGS. 4A-4C schematically illustrate the progression of variables for analysing variance according to a known statistical technique of the "ANOVA" type.
Figure 4B:
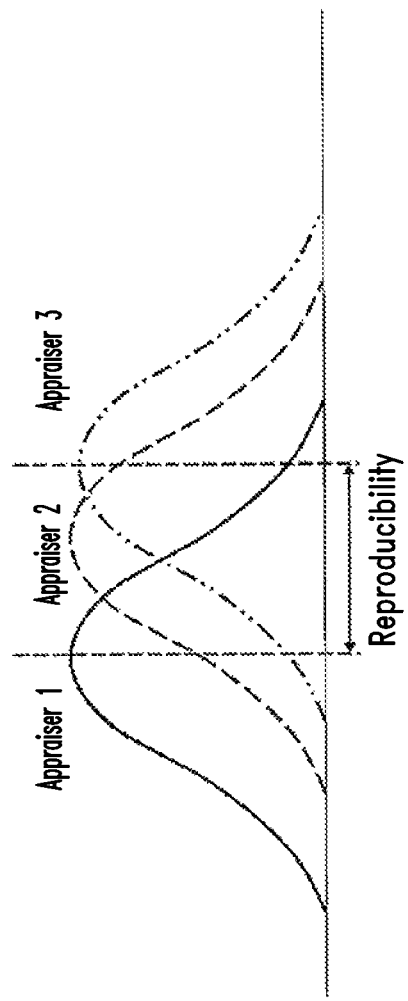
Figure 4C:
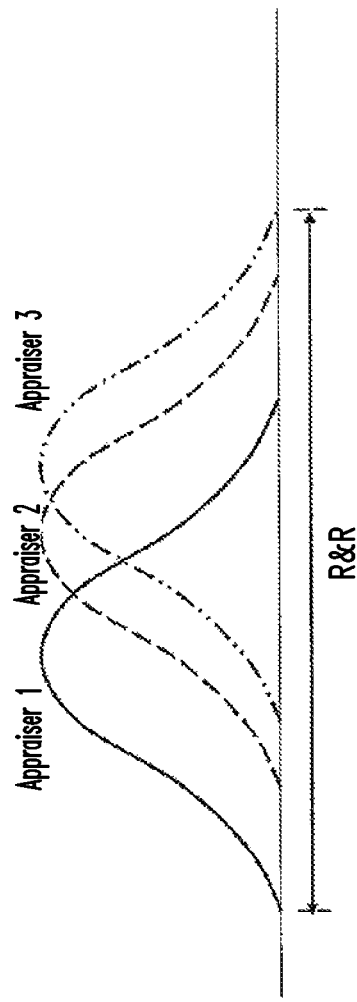
Figure 5:
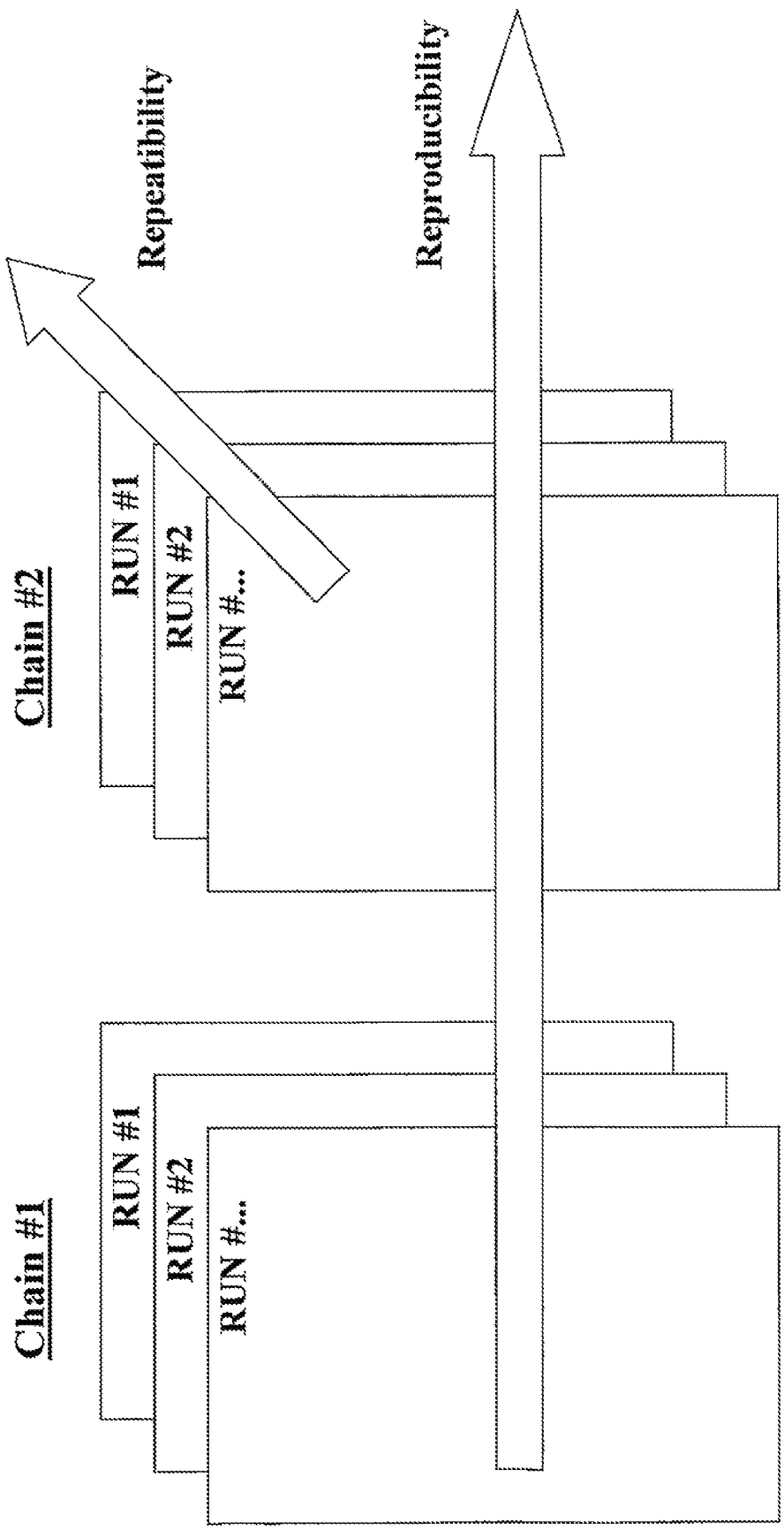
FIG. 5 schematically illustrates a repeatability and reproducibility methodology applied to two measuring chains according to the prior art.

To understand the general idea forming the basis of the present disclosure, firstly consider a generic measuring chain on which it is desired initially to evaluate and check over time repeatability and reproducibility, like for example the one illustrated in FIG. 1 and described in relation to the prior art.

Advantageously, the proposed method for an improved checking of repeatability and reproducibility (R&R), instead of considering the various measuring chains as a whole, provides for breaking down the measuring chains into their basic test units TU, checking repeatability and reproducibility on the various basic test units when considered separately, to then carry out a correlation between the various chains.

In particular, the method comprises separating the basic test units that depend upon the device subjected to measurement or control, in other words upon the DUT and therefore upon the product, from those that do not depend upon such a device.

Furthermore, considering all of the test units that do not depend upon the DUT, the repeatability and reproducibility check is carried out on them independently from the specific DUT.

Given that in general the most complex part of the measurement chain is the apparatus ATE, which does not depend upon the particular DUT, the proposed method firstly ensures that the various resources of the ATE are repeatable and reproducible.

The method therefore comprises a check of repeatability and reproducibility, where applicable, on the test units that depend upon the device DUT subjected to measurement or control, which in general are less complex than the ATE.

Hereafter, the method according to the disclosure considers the measuring chains as a whole and carries out a correlation between the various units of the measuring chains, or between the measuring chains themselves, using the various devices subjected to measurement or control in whatever form they may be.

Considering the specific field of semiconductors, the measuring chains are separated into their basic test units TU, separating the units that depend upon the DUT from those that are independent from it.

FIG. 7 schematically illustrates a measuring chain 10 that includes an ATE 12 and, as test units, a JIG 14 and a probe card 16 that couple the ATE 12 to a set of DUTs, which in this case are chips 18 on a wafer 20. The measuring chain 10 is one of a plurality of measuring chains for EWS testing.

Then the ATE 12, which does not depend upon the end product, is considered separately from the rest of the measuring chain that depends upon the end product.

Therefore, there will be repeatability and reproducibility R&R at the ATE tester level, and repeatability and reproducibility R&R at the product level, where applicable.

For EWS testing, where the DUTs are chips on a wafer, and for final testing FT, where the DUTs are encapsulated chips, it is possible to use the same ATE 12.

Figure 6A:
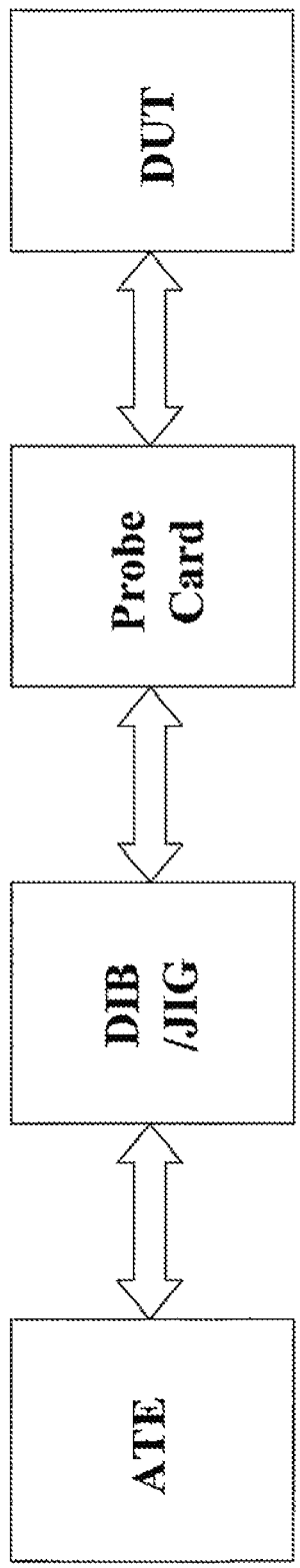
FIG. 6A schematically illustrates an embodiment of a measuring chain for testing chips on a wafer, realised according to the prior art.
Figure 6B:
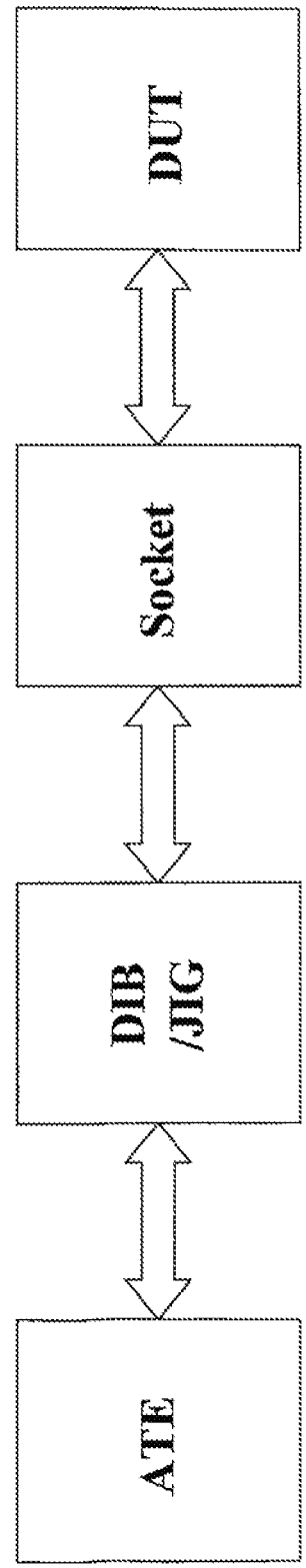
FIG. 6B schematically illustrates a further embodiment of a measuring chain for testing chips which are encapsulated in a package, also realised according to the prior art.

What changes in the measuring chain between EWS and FT are the interfaces between the ATE and the DUT, as schematically illustrated in FIG. 6A (for the EWS) and in FIG. 6B (for the FT).

Figure 8:
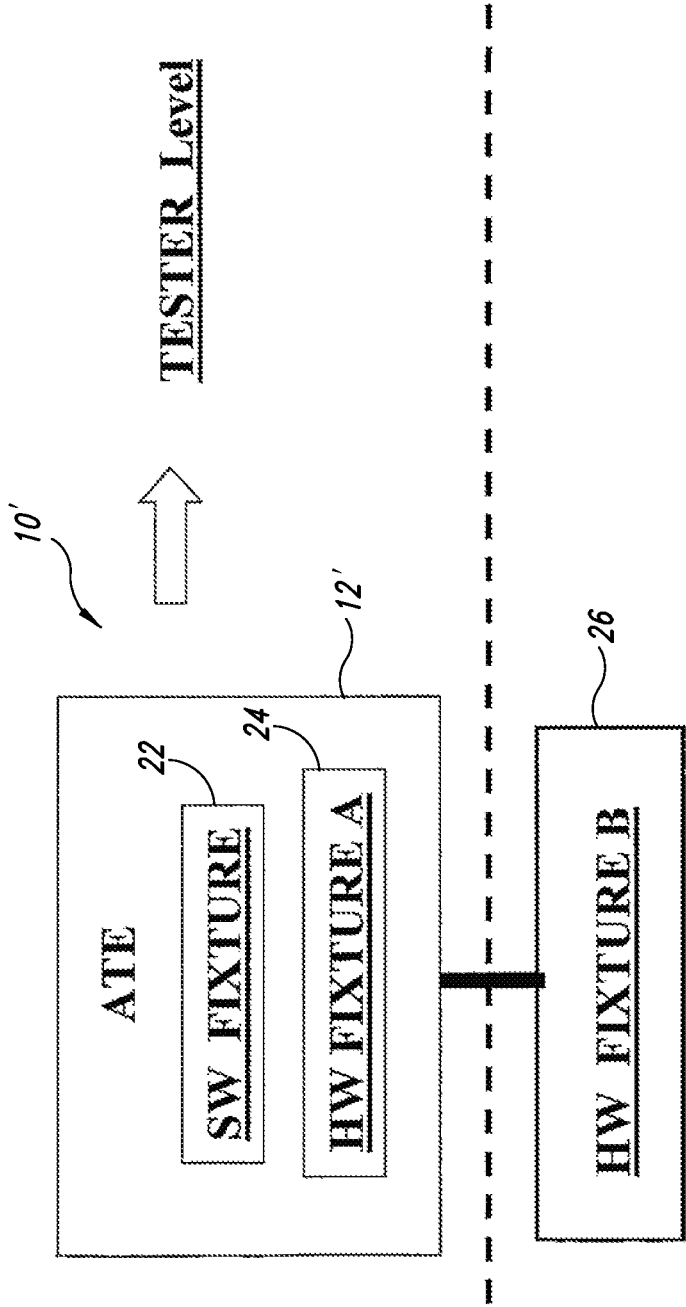
FIG. 8 schematically illustrates an embodiment of a measuring chain that uses the method for an improved checking of repeatability and reproducibility according to the disclosure.

FIG. 8 schematically illustrates a measuring chain 10' that includes an ATE 12' with a structure having a specific protocol for controlling the testing operations for the purposes of checking repeatability and reproducibility.

Advantageously, the ATA 12' generically includes a software (SW) fixture 22 and a first hardware (HW) fixture 24 and the measuring chain 10' further includes a test unit 26 with an internal hardware fixture. The software and hardware fixtures 22-26 are able to align the different ATEs of the same family, or of the same type or with the same configuration with each other. For example, the HW fixtures 24, 26 can each be an electronic structure comprising at least one electronic circuit on which at least one testing software routine (SW fixture 22) carries out at least one measurement associated with the apparatus ATE; such fixtures 22-26 can also incorporate a testing protocol for checking repeatability and reproducibility of each individual measuring unit.

Such fixtures can be software (SW) and/or hardware (HW), associated with the testing apparatus ATE 12' or with the test unit 26, possibly incorporate a testing protocol, and check the repeatability and reproducibility of each individual measuring resource or groups of measuring resources in said measuring unit or ATE. The various groups can, at times, also comprise common resources such as measuring and/or stimulation tools, like for example one signal feeders or generators.

Such resources carry out at least one measurement to evaluate the repeatability and reproducibility of the test unit 26.

Figure 9D:
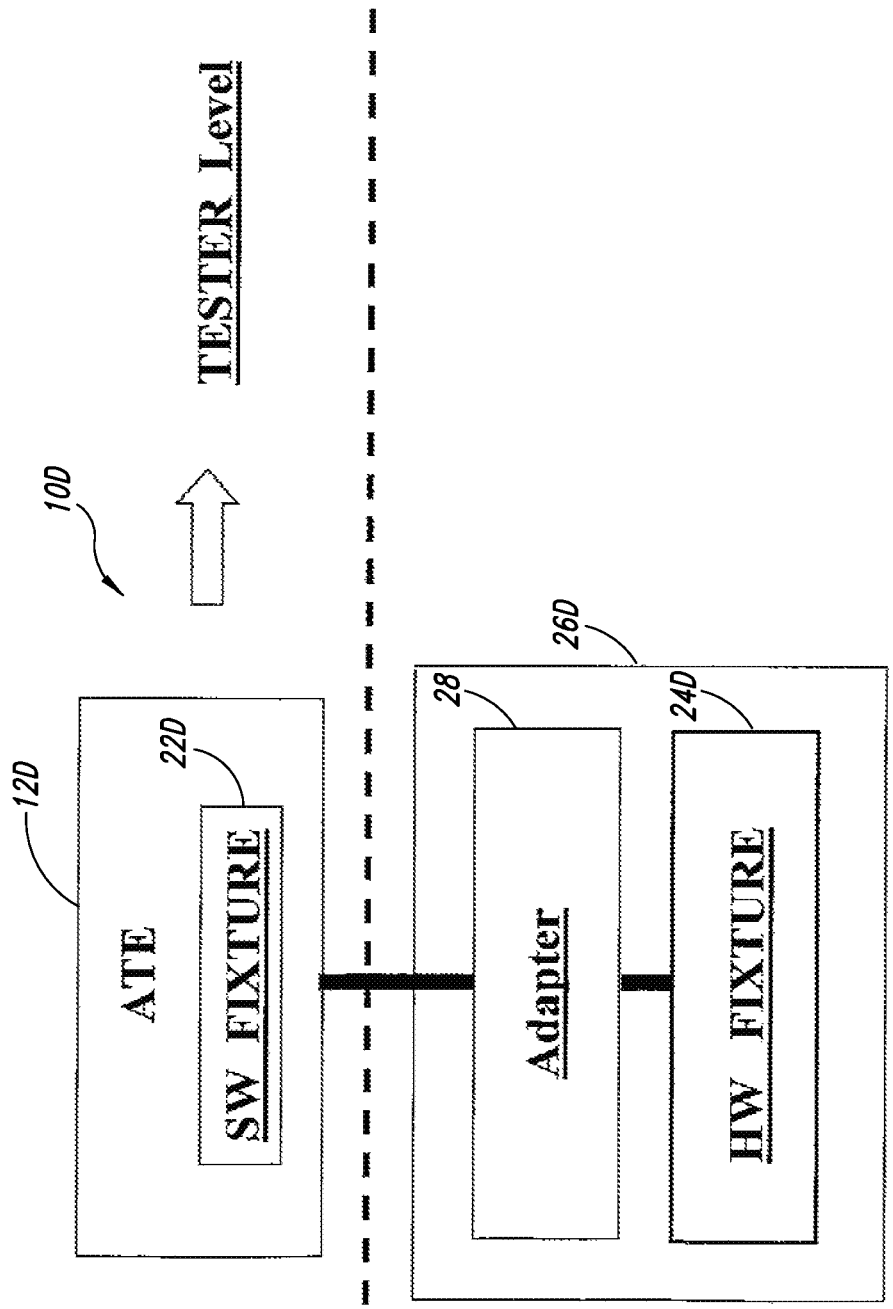

FIGS. 9A-9D schematically illustrate alternative embodiments of the generic measuring chain 10' of FIG. 8. FIG. 9A illustrates an embodiment of a measuring chain 10A that includes an ATE 12A, with an internal software fixture 22A, and a test unit 26A that includes a hardware fixture. The SW fixture 22A can be used by the ATE as if it were a normal testing program, whereas the HW fixture of the test unit 26 is connected to the ATE, and to do this it is preferred to use the same connections used by the ATE of the normal measuring chain to carry out the measurements on the DUTs.

As well as the normal connections used by the ATE 12A in the chain, there can be other connections used for the calibration and checker of the ATE itself.

For repeatability and reproducibility it is possible to use the same connections used by the ATE for the measurements on the DUT and/or the connections used for the calibration and checker of the ATE itself.

If, for some reason, it is decided not to use same connections used by the ATE for the measurements on the DUT, there is the risk that the different electrical path followed weighs upon repeatability and reproducibility, lowering its reliability; consider, for example, RF (radio frequency) measurements.

In the embodiment shown in FIG. 9A for indicating and not limiting purposes, it is provided for the HW fixture to be outside the ATE and in the test unit 26A so that the HW fixture can be used by many ATEs and there can be a single common reference for them.

This hardware fixture does not have to depend upon the particular end DUT, and should be able to stimulate all of the resources of the ATE so that the repeatability and reproducibility check has good coverage, such as to be able to stimulate and measure up to 100% of the resources of the ATE itself.

In general, it is preferred to stimulate just those resources of the ATE that are important for the measurements of the various DUTs, i.e. it is preferred to stimulate and check repeatability and reproducibility of those resources of the ATE that can have a drift over time.

It does not make much sense to check repeatability and reproducibility of resources that are known to be stable over time and aligned with each other with respect to the different measuring chains, given that such resources do not drift over long time periods, also because to do so is not economically advantageous.

FIG. 9B illustrates an embodiment of an ATE 12B with an internal software fixture 22B, and an internal hardware fixture 24B. Unlike the external hardware fixture of the test unit 26A of FIG. 9A, the hardware fixture 24B does not have the role of the single reference through which to align the different ATEs with each other.

Moreover, such a HW Fixture 24B would be checked and recalibrated periodically, but it would be very difficult to ensure that at each moment in which R&R is checked all of the HW fixtures inside the various ATEs are aligned with each other, and are an unequivocal reference considering the ATEs as a whole.

FIG. 9C illustrates an embodiment of a measuring chain 10C that includes an ATE 12C, with internal software and hardware fixtures 22C and 24C, and a test unit 26C that includes a hardware fixture.

It is thus possible to have a single fixture used at times on ATEs of different families, types or configurations. Obviously as the number and type of resources incorporated in an ATE changes, the set of characteristics of the ATE that are measured can be changed.

Therefore ATEs that have identical and different parts can be compared with each other considering the common parts with the same characteristics and specifications thanks to the uniqueness of the fixture.

Of course, ATE apparatuses that are very different from one another can use different fixtures. Alternatively, FIG. 9D schematically illustrates a measuring chain 10D that includes an ATE 12D, with an internal SW fixture 22D, and a test unit 26D that includes an HW fixture 24D and an adapter 28, which mechanically and electrically (or even in another way) interfaces the HW fixture 24D to the ATE 12D.

The HW fixture 24D and the adapter 28 can be considered like an overall HW fixture In this way, it is possible to reuse the same HW fixture as a common reference between ATEs that are even quite different to each other.

Figure 10:
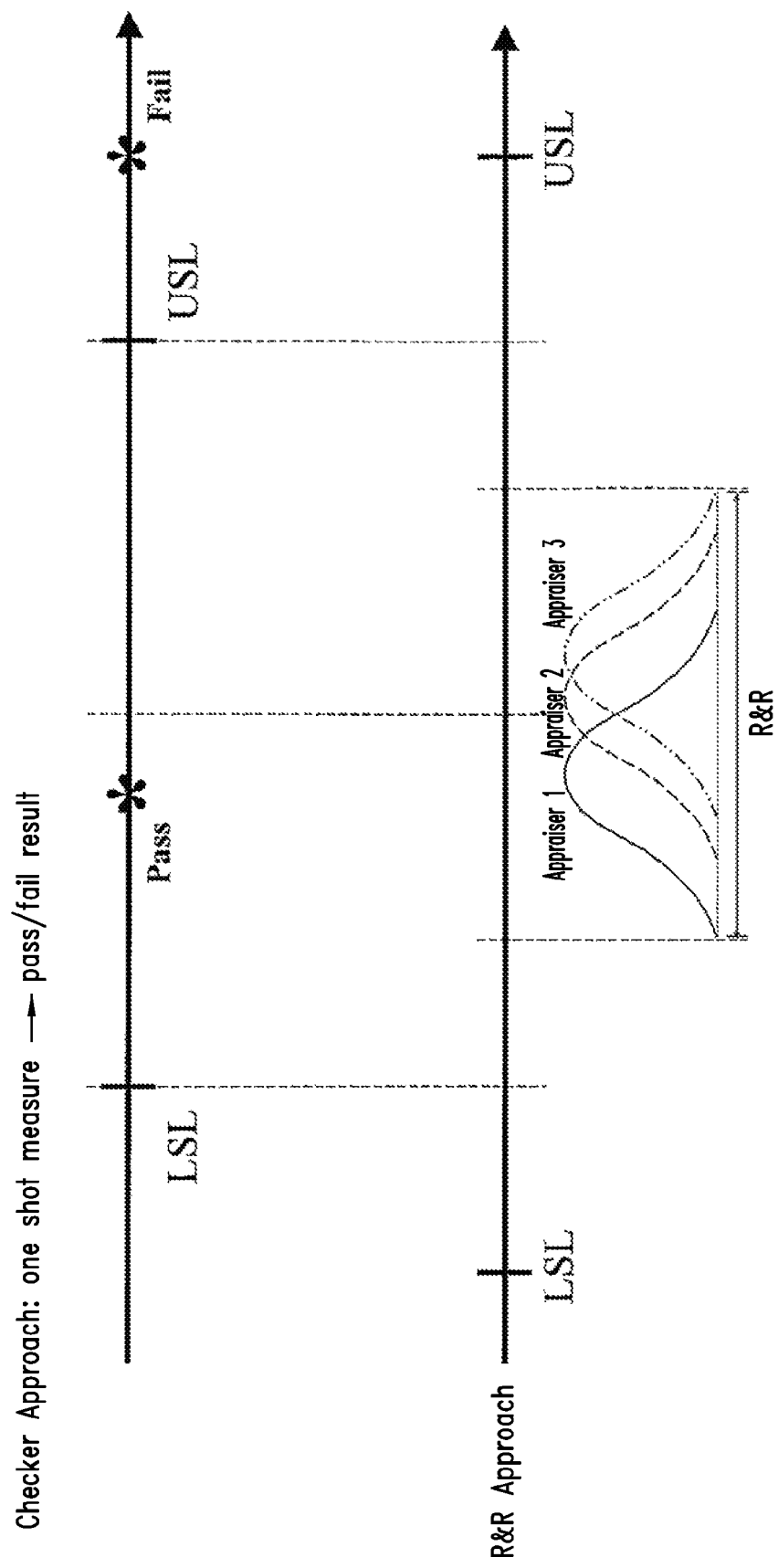
FIG. 10 schematically illustrates a specification to be used in the method for an improved checking of repeatability and reproducibility according to the disclosure for Checkers and the repeatability and reproducibility measurements of the apparatus (ATE)

The HW fixture used for R&R can also form part of the tool that is used to execute the checkers of the ATE, but for R&R such a HW fixture is used in a substantially different way with respect to the checkers, as schematically illustrated in FIG. 10.

Indeed, as stated previously, the checkers, through a value or a precise measurement, check that the generic resource is within its specification and indicate only those resources that are within their specification (Fail) as anomalous.

Here the repeatability and reproducibility of a generic measurement of a characteristic are evaluated by observing their overall variance between the various ATE apparatuses (or Appraiser) over time.

Observing a variance, the specification limits for R&R can be different from the normal specification limits of the resources of the ATE, which refer to precise values and not to variability ranges.

Consequently, it is very important to establish the LSL and USL limits of the repeatability and reproducibility of a generic resource of the ATE, because this can affect the various mathematical indicators, through which the status of the R&R is evaluated, based upon predetermined criteria.

Therefore, the check of repeatability and reproducibility at ATE tester level in the EWS and FT test for semiconductor devices can follow the same approach.

However, it is possible to have repeatability and reproducibility at tester level which are different between EWS and FT considering the same families, types and configurations of ATE due to economic reasons, or with a different group of resources deemed critical.

In any case, in the field of semiconductors the approach for R&R of the ATE can be the same.

Figure 11:
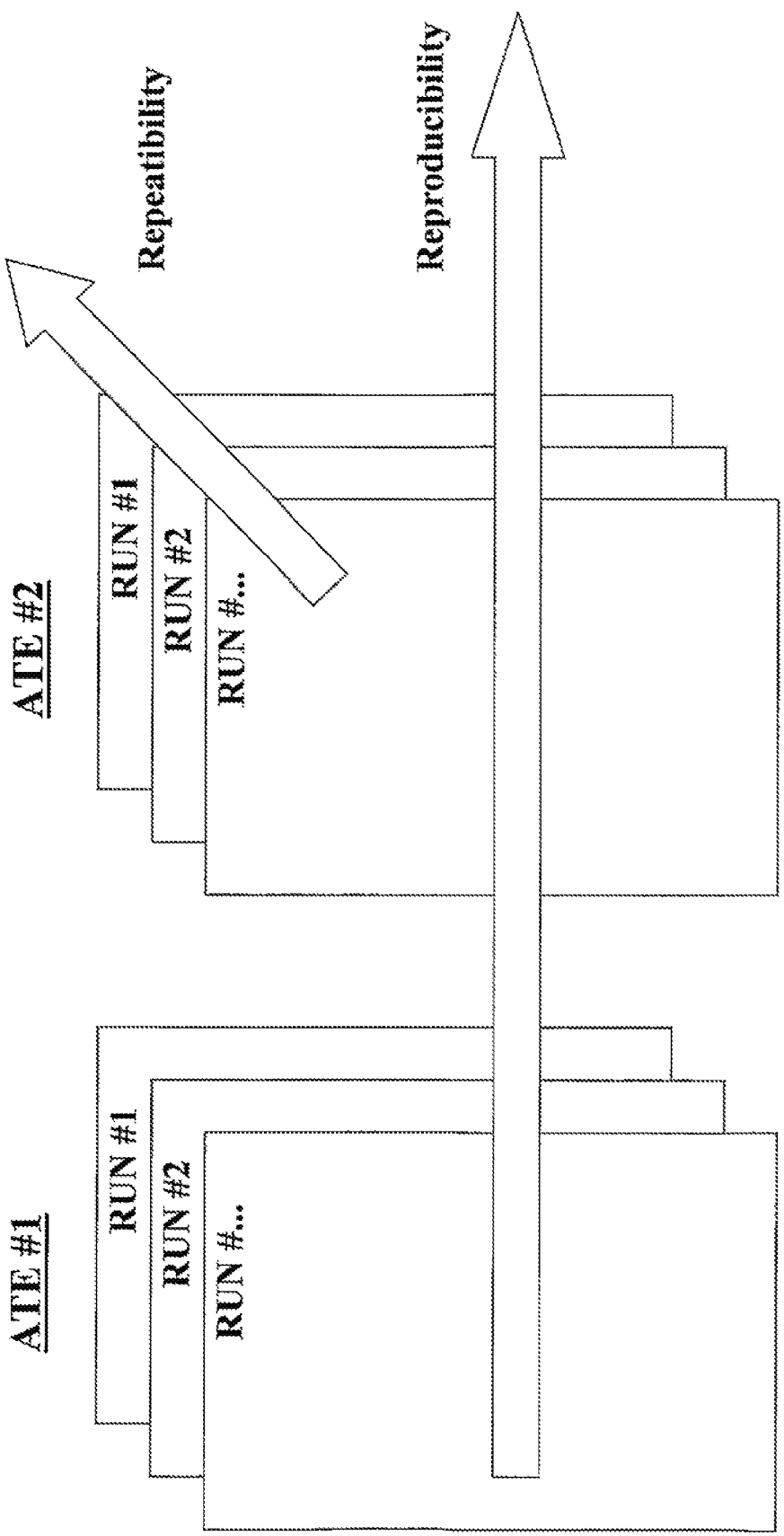
FIG. 11 schematically illustrates the method for an improved checking of repeatability and reproducibility according to the disclosure applied to two ATEs.

In this way, the measurement of at least one characteristic of the ATE can be carried out for N (N>1) times, which we shall call Cycles, in M (M>1) different time periods that we shall call Runs, on the different ATEs, and through a statistical method such as ANOVA the R&R can be calculated, as schematically illustrated in FIG. 11.

In practice, through the fixture (SW or HW), the ATE is able to measure its same characteristics.

Given that the most complex part of the measuring chain is the ATE, this is where the most effort should be made to evaluate R&R.

Initially, evaluating R&R involves carrying out a certain number M of Runs each including a certain number N of measuring Cycles.

After having noted that the various ATEs satisfy the R&R criteria, to periodically check that such ATEs still adhere to the R&R criteria, at each check a certain number (B) of Cycles can be carried out for a certain number (A) of periods or Runs.

If an ATE is modified on its inside or the environmental conditions are changed in a non-negligible way, the evaluation of R&R should be carried out again by performing suitable (D) Cycles for suitable (C) periods or Runs.

Figure 12:
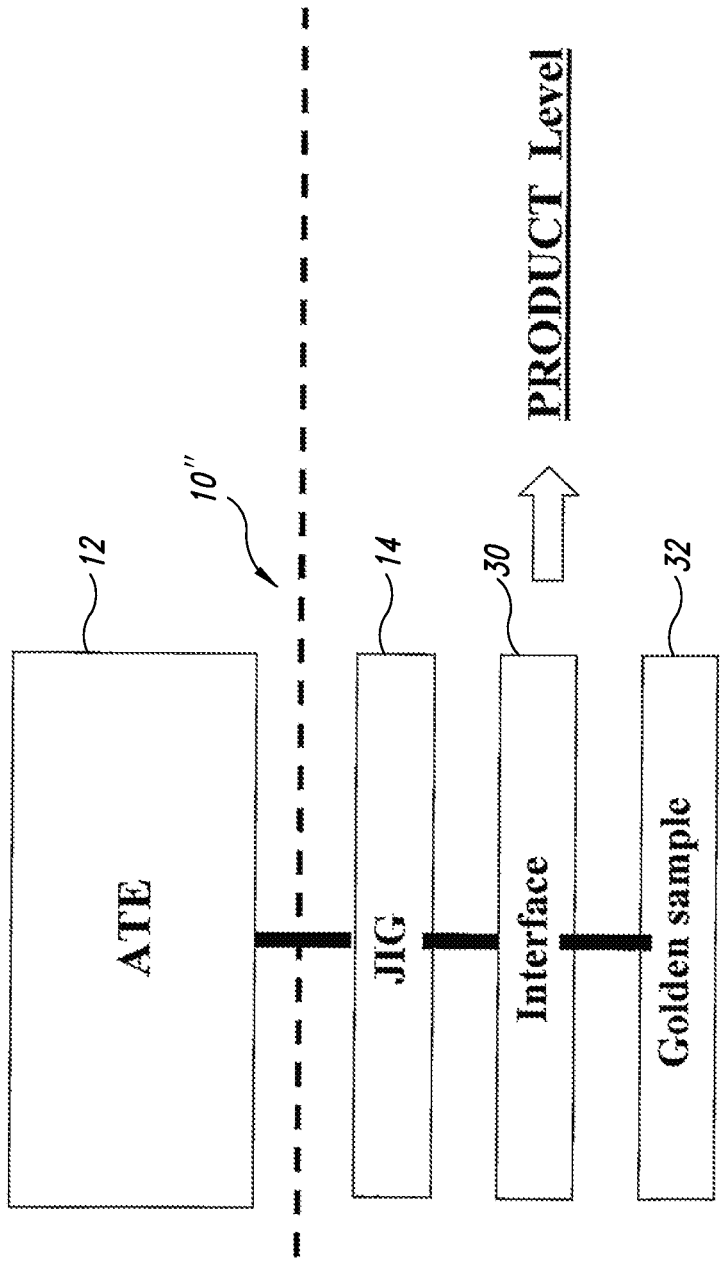
FIG. 12 schematically illustrates a measuring chain that uses golden samples for the method for an improved checking of repeatability and reproducibility according to the disclosure when applied to a Jig unit.

FIG. 12 schematically illustrates a measuring chain 10" that includes the Jig or DIB unit 14, an interface unit 30, and a golden sample 32. The Jig unit or DIB 14 is generally dependent upon the specific product, and R&R can be evaluated using, for example, golden samples including the golden sample 32.

The interface can be a board on which there are the golden samples, which can be welded onto the board itself or inserted into a socket.

In order to evaluate the R&R of Jig units similar to each other, it is provided to use the same ATE and the same golden samples, avoiding applying stress to the golden samples that could change their characteristics.

It may also be possible to evaluate the R&R of the Jig unit without the use of golden samples, but using a special board, similar in concept to the fixture used for the ATE.

For the Jig units, instead of carrying out the R&R, it may be useful sometimes to carry out a correlation exercise, equipped with suitable criteria for evaluating the results of the correlation.

For the probe card or for the socket, since the concept of R&R is not fully applicable, it is possible to consider the normal mechanical, electrical or other type of measurements that are already normally carried out at the current time, evaluating the reliability of the specific probe card or socket based upon them.

Finally, one can carry out a correlation exercise between the various measuring chains, in their standard operating conditions.

Figure 13:
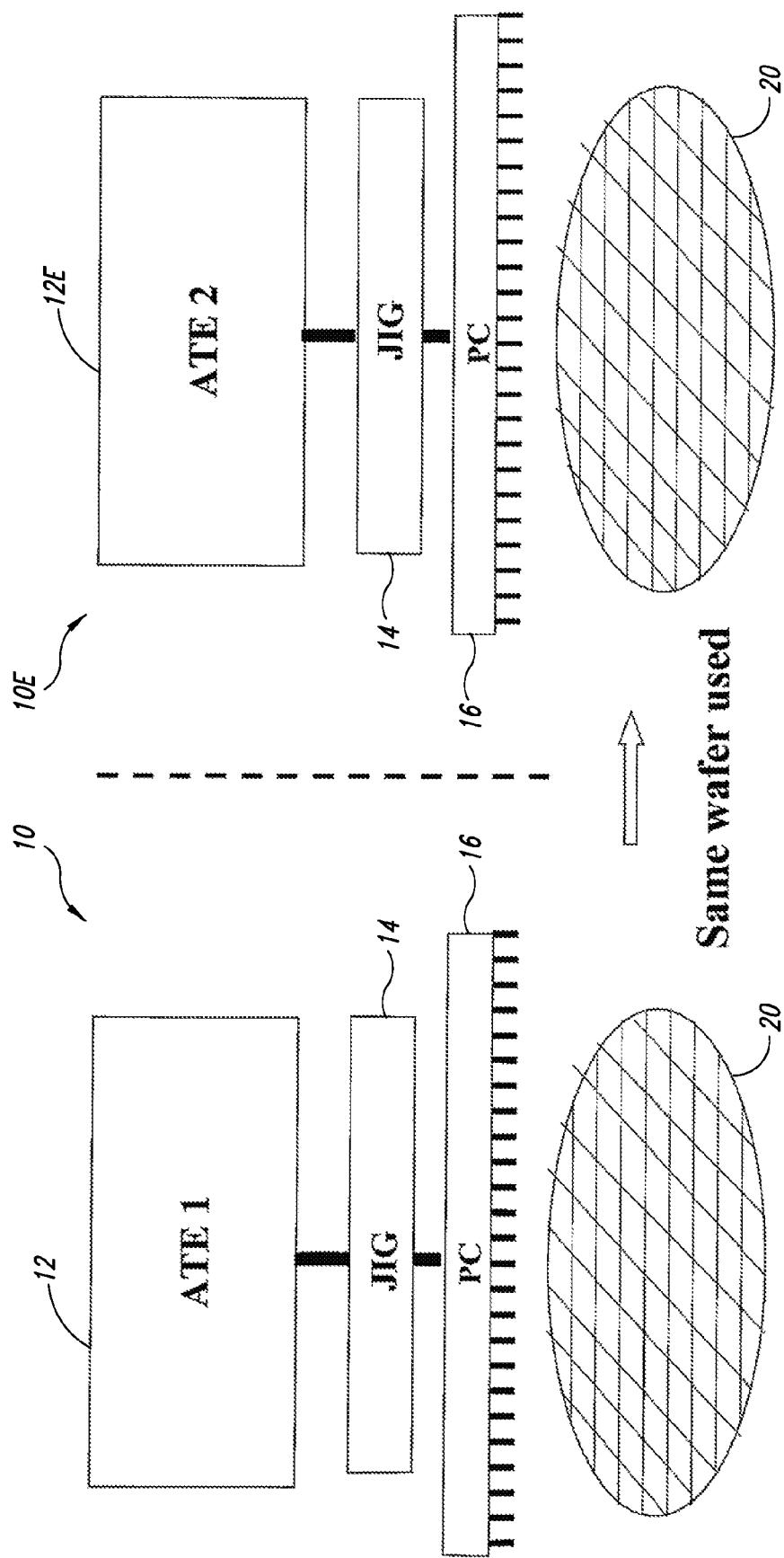
FIG. 13 schematically illustrates a measuring chain for EWS testing of wafers that uses the method for an improved checking of repeatability and reproducibility according to the disclosure.

FIG. 13 schematically illustrates an EWS testing procedure on the wafer 20 using the measuring chain 10 of FIG. 7 and a second measuring chain 10E of the same type which includes a second ATE 12E together with the same Jig 14 and probe card (PC) 16 in the same conditions.

Following the testing and retesting results, by applying criteria that can be linked:
to the classification of the various chips of the wafer, and/or to the variation in yield between testing and retesting,
and/or to particular measured parameters,
it is established whether the measuring chains are reliable.

These criteria should take into account the differences due to the different contact conditions between testing and retesting and the effect of possible stress carried out during the test and possibly repeated in the retest.

At the product level, the various criteria and the rules can depend upon the product itself that is being considered.

If the correlation has a successful outcome the measuring chains are qualified to measure the specific product, according to this method for evaluating R&R.

Figure 14:
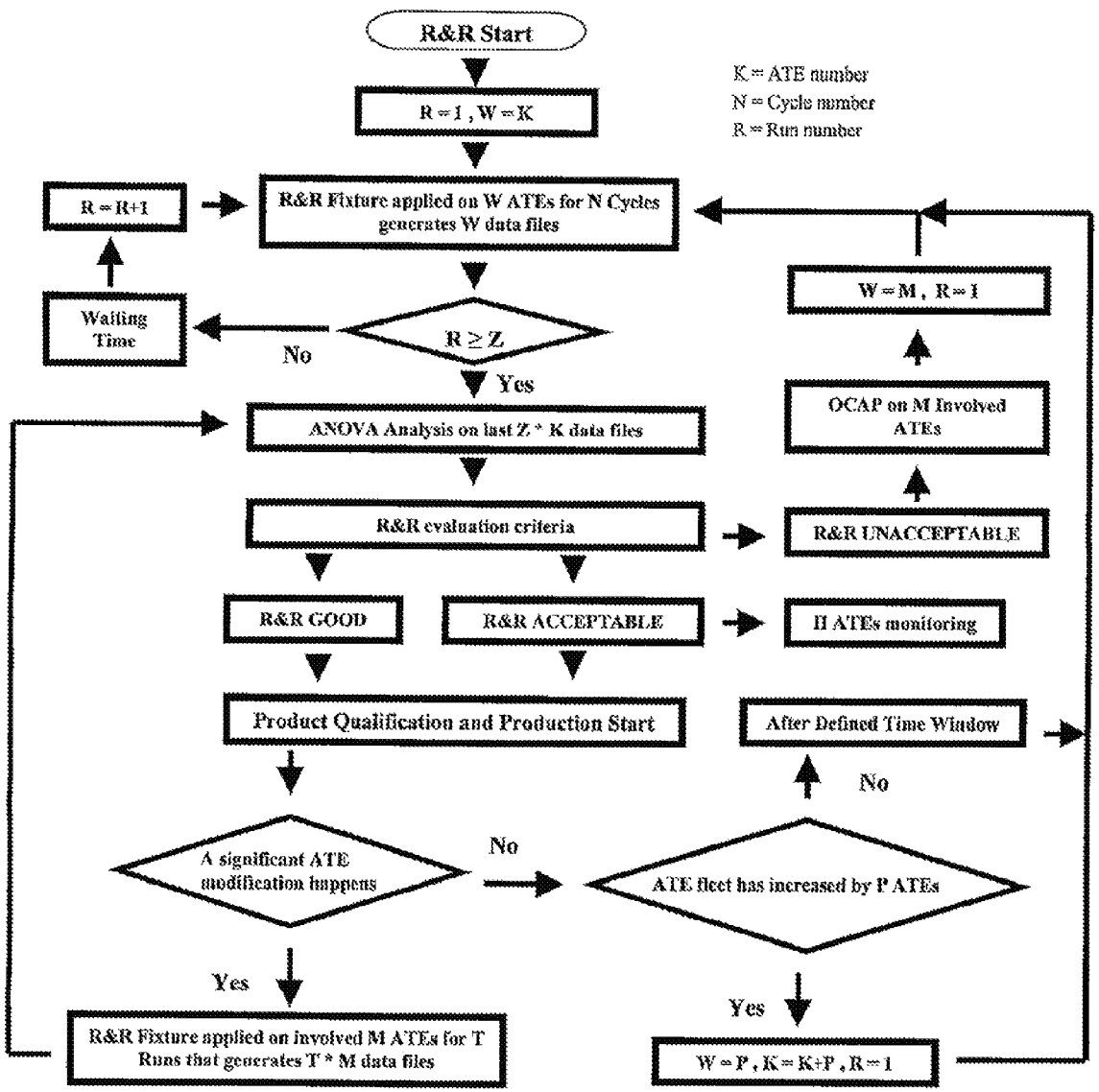
FIG. 14 schematically illustrates the flow diagram of the method for an improved checking of repeatability and reproducibility according to the disclosure.

FIG. 14 is a flow chart that shows one of the possible ways to proceed to initially evaluate and check over time that the measuring chains are and continue to be in accordance with the R&R criteria, based upon what is described above.

This general flow can in any case be changed and improved based upon specific specifications and the field of application of the new methodology for evaluating and checking R&R described previously.

Considering a group of K different apparatuses ATE for which the R&R fixture is applicable, at different times it is possible to carry out Z Runs each of N measuring Cycles through the fixture associated in common or with each ATE, to acquire the measurements of the characteristics of interest of the K apparatuses ATE in order to obtain the initial evaluation of R&R.

Let it be assumed that to carry out the individual Run on the K ATEs, the fixture is gradually applied on the K ATEs, and a data file is thus obtained for each ATE containing all of the information and measurement data useful for calculating R&R.

Therefore, Z*K data files are obtained to which to apply the ANOVA analysis and to obtain R&R.

Based upon selected evaluation criteria it is possible to establish that the R&R of the group of ATEs is good, or else is acceptable or worse is unacceptable.

If the R&R is unacceptable, this may be due to a subgroup M of apparatuses ATE that have some characteristics not aligned with the other apparatuses ATE of the entire measuring system.

It is thus possible to intervene on the M apparatuses ATE and on their component parts that are misaligned based upon an OCAP (Out of Control Action Plan) aimed at solving these specific problems.

After having solved these problems, the M ATEs once again carry out Z Runs each of N Cycles, and reperform the ANOVA analysis of the last Z data files of the K ATEs of the group, and consequently evaluate the new R&R.

If, on the other hand, the R&R is acceptable, there will be H apparatuses ATEs for which some characteristics could be slightly misaligned with respect to the other ATEs of the group, but this is in any case considered acceptable.

This can indicate that some ATEs have some of its parts drifting and consequently they should be kept under surveillance with specific monitoring.

Therefore, there is the possibility of identifying the drift of an apparatus ATE and of thus being able to predict its malfunction or its breaking in the future.

If, on the other hand, the R&R is good or in any case is acceptable, the step of evaluating R&R at ATE tester level is over, and it is possible to move on to the step of evaluating R&R at the product level, which comprises the qualification of the chains for the specific product considered, to measure such a product with these chains.

For the step of evaluating the product R&R, it is considered that all of the units of the measuring chain depending upon the product have already been qualified according to what has been stated previously.

For each type of unit it is possible to follow a flow that can basically be very similar to the one presented for the ATE.

After this it is possible to carry out the correlation using at least one device DUT from those subjected to the quality control.

For example, if the generic DUT is represented by a chip on a wafer, the testing and retesting of at least one wafer is carried out on at least two different measuring chains in the same conditions and based upon some criteria it is decided whether the correlation is valid or not for the group of measuring chains to be considered R&R for the product, which can consequently be measured on the group of measuring chains themselves.

In any case, at regular intervals it is checked that the apparatuses ATE of the group still conform to the R&R criteria already achieved, and therefore at least one Run should be carried out for the K ATEs and the ANOVA analysis should be redone at least for the last Z*K data files to determine whether there are still the R&R conditions based upon the established criteria.

If there is a significant change of M ATEs of the group it should be checked that the ATEs of the group are still R&R compliant, and then at least one Run should be carried out for the M ATEs and the ANOVA analysis should be redone for the last Z*K data files to determine whether there are still the R&R conditions based upon the established criteria.

If P ATEs are added to the group of ATEs it should be checked that the ATEs of the group are still R&R compliant, and then Z Runs should be carried out on the P ATEs and the ANOVA analysis should be redone for at least the last Z*K data files (where K=K+P i.e. the new value of K is increased by P with respect to the old value of K) to determine whether there are still the R&R conditions based upon the established criteria.

If the group of ATEs on which a certain fixture is applicable is divided into at least two subgroups in at least two different geographical locations sufficiently distanced from one another, it is possible to have a single fixture for the entire overall group, or a fixture for each subgroup.

If there are many identical fixtures for the various subgroups, one can periodically carry out the R&R of the fixtures, to check that such fixtures are aligned with each other, and one can do this using the same ATE on which the evaluation or the check of R&R of the various fixtures is carried out.

The use of ANOVA analysis should not, however, be considered limiting, and in the literature there are already alternative criteria for evaluating R&R.

Everything that has been stated for EWS testing is valid in an analogous manner for FT, WLBI and parametric testing.

The proposed method for evaluating and checking R&R can also be applied in a similar way in different fields to that of semiconductors, with embodiments in accordance with the specific field of application.

In conclusion, the method according to the disclosure allows an improved evaluation of R&R to be obtained on the measuring chain by separating the units of the chain that do not depend upon the product from those that depend upon the product.

Effort is concentrated above all on the most complex unit which is the ATE, and by using one or more of the internal fixtures, it is possible to obtain an evaluation of the R&R that does not depend upon the specific product, checking the R&R of all of the resources considered critical of the ATE and thus having higher coverage of the test, allowing the measurement of many thousands of characteristic parameters of the ATE to be carried out.

In this way, all of the ATEs of the group on which a certain fixture is applied are actually aligned with each other.

Thanks to this it is possible to do a thorough evaluation of the ATE that allows those parts that are or are about to drift or, in the worst case, that are subject to breaking over time to be identified.

Consequently, it is possible to monitor and intervene on the ATE itself even productively to organise in the best possible way preventive maintenance or to restore correct functionality, without having to wait for it to break.

Having concentrated on the most complex part of the measuring chain, the evaluation of R&R on the remaining part of the chain that depends upon the product is simplified, up to the point of managing to qualify a group of measuring chains on which a certain fixture is applicable, thanks to a correlation exercise.

The golden sample concept of measuring chains is thus unnecessary, with a saving in economic terms as far as the creation, certification or replacement of the golden samples themselves is concerned.

By separating the chain into its various units to evaluate R&R, it is simpler to identify and solve the problems and difficulties that weigh down upon R&R itself, and this also makes the group of measuring chains more reliable.

Moreover, the proposed method makes the evaluation of R&R efficient and effective, which is not currently possible with the current methodology in the field of semiconductors due to certain parts of the measuring chain on which the R&R methodology is not applicable.

This method, as well as the increase in reliability of the group of measuring chains, increases the production yield, the efficiency and the production capacity, and the R&R also becomes a truly useful tool, which requires less overall effort than the current methodology, with better results.

The proposed method evaluates the R&R of each unit of the chain, in accordance with the individual unit considered, which is not done with the existing approach.

It is worth highlighting the fact that the proposed method can be applied in general wherever it is desired to ensure the repeatability and reproducibility of any electrical or electronic measuring system.

It particularly applies:
to the electrical testing process of wafers (Electrical Wafer Sort or more generally Wafer Sort)
to the Final Test FT (where the chips are encapsulated in the package)
to the Wafer Level Burn-In WLBI (electrical testing that carries out tests, also of temperature, with stress)
to the parameter testing carried out on TEGs (Test Element Group, which are a group of elementary structures present on wafers, arranged in the scribe lines).

In any case, the same principle can also be applied in different ways to other types of measuring systems.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
checking repeatability and reproducibility of a plurality of measuring chains for semiconductor device testing, each measuring chain including a testing apparatus and concatenation of test units between the testing apparatus of the measuring chain and a device to be tested, the checking including:
checking repeatability and reproducibility of at least one of the test units of each of said measuring chains;
making a correlation between the measuring chains as a whole, wherein checking the repeatability and reproducibility of the at least one of the test units of each of said measuring chains comprises checking the repeatability and reproducibility of test units of the measuring chains that depend upon the device to be tested separately from checking the repeatability and reproducibility of test units of the measuring chains that do not depend upon the device to be tested.

2. A method according to claim 1, wherein checking the repeatability and reproducibility of at least one of the test units of each of the measuring chains comprises testing the device to be tested, under a set of operating conditions, using a first measuring chain of the plurality of measuring chains and re-testing the device to be tested, under the same first set of operating conditions, using a second measuring chain of the plurality of measuring chains.

3. A method according to claim 1, wherein checking the repeatability and reproducibility of at least one of the test units includes using a software or a hardware fixture associated with the at least one of the test units.

4. A method according to claim 1, wherein checking the repeatability and reproducibility of the plurality of measuring chains includes using a software or hardware fixture, associated with said testing apparatus, to check the repeatability and reproducibility of at least one group of measuring resources of the testing apparatus.

5. A method according to claims 4, wherein said fixture comprises a testing protocol.

6. A method according to claim 1, wherein the measuring chains respectively including different testing apparatuses and checking repeatability and reproducibility of the plurality of measuring chains includes measuring at least one characteristic of said different testing apparatuses for N times or cycles, in M different time periods or runs, through a statistical method.

7. A method according to claim 6, wherein, for each measuring chain, said measuring is carried out for the measuring chain each time that said testing apparatus of the measuring chain is modified or environmental conditions are modified by a not negligible amount.

8. A method according to claim 6, wherein the statistical method is an ANOVA statistical method.

9. A method according to claim 1, wherein the device to be tested is a chip on a semiconductor wafer, the method further comprising testing and retesting the wafer using two different measuring chains of the plurality in the same operative conditions before correlating the two different measuring chains.

10. A method according to claim 1, wherein checking the repeatability and reproducibility of the at least one of the test units of each of said measuring chains involves only checking the repeatability and reproducibility of measuring resources of the test units that are critical for measuring said devices to be tested.

11. A method according to claim 1 wherein checking the repeatability and reproducibility of the plurality of measuring chains includes evaluating repeatability and reproducibility each testing apparatus followed by the checking the repeatability and reproducibility of the at least one of the test units of each of said measuring chains.

12. A method according to claim 11, evaluating the repeatability and reproducibility each testing apparatus is repeated at regular intervals.

13. A method, comprising:
checking repeatability and reproducibility of a plurality of measuring chains for semiconductor device testing, each measuring chain including a plurality of test units coupled to a device to be tested, the checking including:
separately checking repeatability and reproducibility of each of the test units of each of said measuring chains; and
checking the repeatability and reproducibility of each of said measuring chains as a whole separately from checking the repeatability and reproducibility of each of the test units of each of the measuring chains.

14. A method according to claim 13, wherein checking the repeatability and reproducibility of each of said measuring chains as a whole comprises testing the device to be tested, under a set of operating conditions, using a first measuring chain of the plurality of measuring chains and re-testing the device to be tested, under the same first set of operating conditions, using a second measuring chain of the plurality of measuring chains.

15. A method according to claim 13, wherein the measuring chains respectively including different testing apparatuses and checking the repeatability and reproducibility of each of said measuring chains as a whole includes measuring at least one characteristic of said different testing apparatuses for N times or cycles, in M different time periods or runs, through a statistical method.

16. A method according to claim 13, wherein the device to be tested is a chip on a semiconductor wafer, the method further comprising testing and retesting the wafer using two different measuring chains of the plurality in the same operative conditions before correlating the two different measuring chains.

17. A method according to claim 13, wherein the measuring chains respectively including different testing apparatuses and separately checking repeatability and reproducibility of each of the test units of each of said measuring chains includes evaluating repeatability and reproducibility of each testing apparatus followed by checking the repeatability and reproducibility of each of the test units of each of said measuring chains.

18. A method according to claim 13, wherein separately checking repeatability and reproducibility of each of the test units of each of said measuring chains includes checking repeatability and reproducibility of test units of the measuring chains that depend upon the device to be tested separately from checking the repeatability and reproducibility of test units of the measuring chains that do not depend upon the device to be tested.

* * * * *